US012615964B2

(12) United States Patent
Jiao et al.

(10) Patent No.: US 12,615,964 B2
(45) Date of Patent: Apr. 28, 2026

(54) STRUCTURE DISPLACEMENT SELF-POWERED SENSOR BASED ON POST-BUCKLING PIEZOELECTRIC EFFECT

(71) Applicant: ZHEJIANG UNIVERSITY, Zhejiang (CN)

(72) Inventors: Pengcheng Jiao, Hangzhou (CN); Egbe King-James, Abuja (NG); Wentao Li, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 836 days.

(21) Appl. No.: 17/985,930

(22) Filed: Nov. 14, 2022

(65) Prior Publication Data

US 2023/0157178 A1 May 18, 2023

(30) Foreign Application Priority Data

Nov. 15, 2021 (CN) .......................... 202111346952.5

(51) Int. Cl.
*H01L 41/113* (2006.01)
*H02N 2/18* (2006.01)
*H10N 30/30* (2023.01)

(52) U.S. Cl.
CPC ........... *H10N 30/302* (2023.02); *H02N 2/181* (2013.01); *H10N 30/306* (2023.02)

(58) Field of Classification Search
CPC .... H10N 30/30; H10N 30/302; H10N 30/304; H10N 30/306; H10N 30/308
(Continued)

(56) References Cited

U.S. PATENT DOCUMENTS

| | | | |
|---|---|---|---|
| 2007/0186689 A1 | 8/2007 | Fukuda et al. | |
| 2009/0179523 A1* | 7/2009 | Wang ..................... | B82Y 10/00 |
| | | | 29/25.35 |
| 2009/0309456 A1* | 12/2009 | Stollberg ................ | H02N 2/18 |
| | | | 29/25.35 |

FOREIGN PATENT DOCUMENTS

| | | |
|---|---|---|
| CN | 110226238 A | 9/2019 |
| CN | 111551269 A | 8/2020 |

(Continued)

OTHER PUBLICATIONS

CN First Office Action(202111346952.5); Date of Mailing: Jun. 16, 2022.

*Primary Examiner* — Derek J Rosenau

(74) *Attorney, Agent, or Firm* — Wiersch Law Group

(57) ABSTRACT

A structure displacement self-powered sensor based on the post-buckling piezoelectric effect comprising an upper unit, a lower unit, a traction system and an information transmission system. The upper unit is slidably connected with the lower unit; the upper unit includes an upper deformable plate and an upper piezoelectric film bonded to the upper deformable plate; the lower unit comprises a lower deformable plate and a lower piezoelectric film bonded to the lower deformable plate; when the upper deformable plate and the lower deformable plate are deformed, a voltage signal is generated and transmitted to the information transmission system through the data acquisition unit. The present disclosure can monitor the settlement of the pier or the expansion or contraction in the expansion gap of the structure by monitoring the output voltage of the equipment. The present disclosure is self-powered and can work for a long time, normally with minimal maintenance.

10 Claims, 6 Drawing Sheets

(58) Field of Classification Search
USPC ......................................................... 310/339
See application file for complete search history.

(56)                         References Cited

FOREIGN PATENT DOCUMENTS

| | | |
|---|---|---|
| CN | 111551271 A | 8/2020 |
| DE | 102011080114 A1 | 1/2013 |
| TW | 202118450 A | 5/2021 |

* cited by examiner

STRUCTURE DISPLACEMENT SELF-POWERED SENSOR BASED ON POST-BUCKLING PIEZOELECTRIC EFFECT

CROSS-REFERENCE TO RELATED APPLICATIONS

The present application claims priority to Chinese Patent Application No. 202111346952.5, filed on Nov. 15, 2021, the content of which is incorporated herein by reference in its entirety.

TECHNICAL FIELD

The present disclosure belongs to the field of structural health monitoring and in particular, to a structure displacement self-powered sensor based on post-buckling piezoelectric effect.

BACKGROUND

Structural health monitoring system is an important part of intelligent civilian infrastructure. The core of structural health monitoring is to use time-varying data to identify structural damage systematically. The structural health monitoring system uses sensing technology to track and evaluate the symptoms of operational accidents, anomalies, deterioration or damage indicators that may affect operations, availability, safety or reliability. A growing trend is to develop sound structural health monitoring methods to continuously monitor, obtain, verify and analyze technical data, so as to promote life cycle management decisions. During the past three decades, many structural health monitoring methods based on various principles have been developed. These methods have been used for global and local damage monitoring. Entire damage detection involves the overall response of the structure, such as changes of vibration mode and natural frequency of the structure. Local damage detection mainly focuses on the screening of damage (such as crack, displacement, deflection and settlement) of small-scale components and sub-components. Recent research in the field of piezoelectric devices shows that piezoelectric materials can make sensor networks have the potential of sustainable power supply.

At present, sound infrastructure from large buildings to long-span bridges has been being built all over the world. One of the main reasons for structural damage is the cracks caused by expansion or contraction occurs under the surface. When the soil where the building is located moves, so does the structure above, which is the reason why expansion joints are provided in large-scale structures (usually over 25 m in span). Small-scale expansion usually fails to be noticed or monitored. The monitoring of the structure includes monitoring small-scale defects within the usability requirements. Expansion monitoring plays an important role in structural health monitoring, especially in the areas where earthquake and vibration often occurs or the subsoil is quite unstable, such as clay or ponding areas.

Scientific basis for the present disclosure is provided by the research on the post-buckling phenomenon of the plate and the performance of the thin plate. When the plate is axially loaded or moved to be limited between two rigid constraints, the behaviors thereof is similar with the motion of a snake between two parallel walls. This kind of unique behavior is called post-buckling. Post-buckling of the plate can be used to generate a low voltage from a widely used material called a piezoelectric film.

Piezoelectric material is a material that generates voltage when mechanically deformed by external force. Conversely, the material also deforms when a voltage is applied across the both ends thereof. This phenomenon is called piezoelectric effect. Piezoelectric principles have been applied in the development of practical sensors and actuators around the world, and the output voltage can be adjusted to make the voltage related to specific deformation.

In consideration of the above problems of differential settlement and structural expansion, the present disclosure provided a structure displacement self-powered sensor, which can be used to monitor the expansion gap in large structures and bridges, as well as the differential settlement of piers. The problem to be solved by the present disclosure is to monitor the settlement of the pier or the expansion or contraction in the expansion slot of the structure by monitoring the output voltage of the device. The innovation of the present disclosure is that the device is self-powered and can work for a long time while requiring minimal maintenance to function properly. The device has two data collection and storage units for recording voltage events and time. The two units collect data under pressure, but only one unit collects data under tension. By comparing the voltage events and time in the two collection units, the user can detect how much displacement has occurred, as well as the direction of displacement. The device also has a shear connection plate to detect shear displacement or settlement in the expansion area.

SUMMARY

In view of the settlement monitoring problem existing in the structural health monitoring, the present disclosure discloses a structure displacement self-powered sensor based on post-buckling piezoelectric effect.

The present disclosure is realized by the following technical solution: a structure displacement self-powered sensor based on post-buckling piezoelectric effect includes an upper unit, a lower unit and an information transmission system. The upper unit and the lower unit are slidably connected. The upper unit includes an upper deformable plate and an upper piezoelectric film. The upper piezoelectric film is bonded to the upper deformable plate. The lower unit includes a lower deformable plate and a lower piezoelectric film. The lower piezoelectric film is bonded to the lower deformable plate. When the upper deformable plate and the lower deformable plate are deformed, a voltage signal is generated, and transmitted to the information transmission system for data reading and recording.

Further, the upper end surface of the upper unit is installed with an upper end connector. The lower end surface of the lower unit is installed with a lower end connector. The upper end connector and the lower end connector install the unit between two parallel surfaces.

Further, when the upper and the lower end connector are perpendicular to the two parallel surfaces, the direct displacement can be monitored. When the upper and the lower end connector are inclined to two parallel surfaces, the shear displacement can be monitored.

Further, the upper unit includes an upper rigid constraint. The upper rigid constraint includes two parallel rectangular plates. The upper deformable plate is installed between the two parallel rectangular plates of the upper rigid constraints for fixing. The lower unit includes a lower rigid constraint. The lower rigid constraints includes two parallel rectangular plates with sliding grooves, and the size of the sliding grooves matches the upper rigid constraints. The upper rigid constraints is inserted into the sliding groove of the lower rigid constraints for sliding connection, and the lower deformable plate is installed between the two parallel rectangular plates of the lower rigid constraints for fixing.

Further, the upper data acquisition unit collects and stores voltage data from the upper unit when the upper deformable plate and the upper piezoelectric film are deformed, and the lower data acquisition unit stores the voltage data from the lower unit when the lower deformable plate and the lower piezoelectric film are deformed.

Further, in addition to a traction rope and the deformable plate, the upper unit includes an upper rigid unit, and the upper rigid unit includes a B-type and an A-type traction rope hole that are configured for the traction rope to pass through.

Further, the traction system includes a traction system anchor point, a B-type traction rope, an A-type traction rope, and a traction rope connection point. The traction system anchor point is connected to the upper deformable plate through the traction rope connection point. Further, one end of the A-type traction rope is fixed to the traction system anchor point, the other end passes through the traction rope connection point, enters from the upper data acquisition unit side, leads out of the same side, and then is fixed on the upper data acquisition unit to stabilize the upper structure of the structure displacement self-powered sensor in the vertical direction. One end of the B-type traction rope is fixed to the traction system anchor point, and the other end of the B-type traction rope passes through the traction rope connection point, winds from a side of a vertical direction of the upper deformable plate to the other side of the vertical direction of the upper deformable plate, and then is connected to the traction rope connection point, which stabilizes the structure of the structure displacement self-powered sensor in the horizontal direction.

Further, the lower deformable plate includes four guide rods, which are inserted into four guide holes of the upper deformable plate, respectively, so that the upper and the lower deformable plates are kept aligned with each other.

Further, the upper rigid constraint includes an outward protrusion to limit the range of displacement.

Further, the information transmission system includes a diode bridge, a capacitor, a voltage stabilizer, a data recorder and a data reader. An electrical signal generated by the upper and the lower deformable plate under the piezoelectric effect is rectified by the diode bridge and has charges stored by the capacitor, and then forms a stable voltage by the voltage stabilizer, which is used to supply the data recorder and data reader to record and read monitoring data. The information transmission system is powered by electrical energy generated under the piezoelectric effect, and the device can work without external power supply within its service life.

Beneficial effects of the present disclosure: the structure displacement self-powered sensor provided by the present disclosure can monitor the settlement of the pier or the expansion or contraction in the expansion slot of the structure by monitoring the output voltage of the equipment. The innovation of the present disclosure is that the device is self-powered and can work for a long time while requiring minimal maintenance to function properly. The invention has great application value in the field of structural health monitoring, such as the monitoring of expansion slots in bridges and large structures.

4

Figure 2:
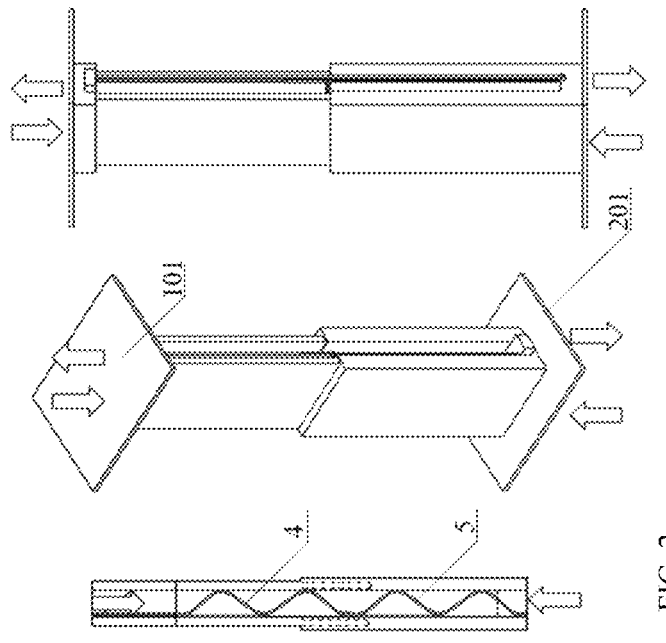
Figure 2:
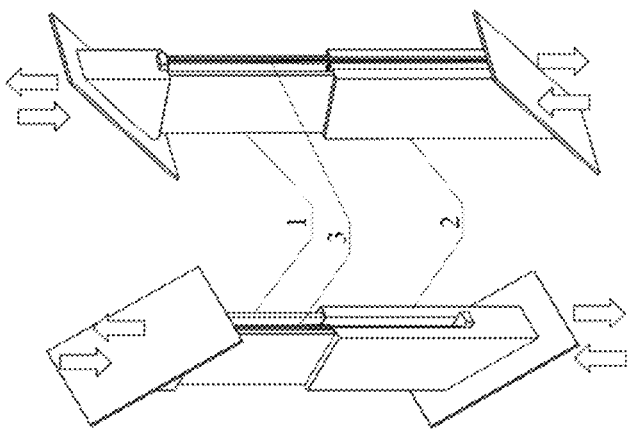
Figure 3:
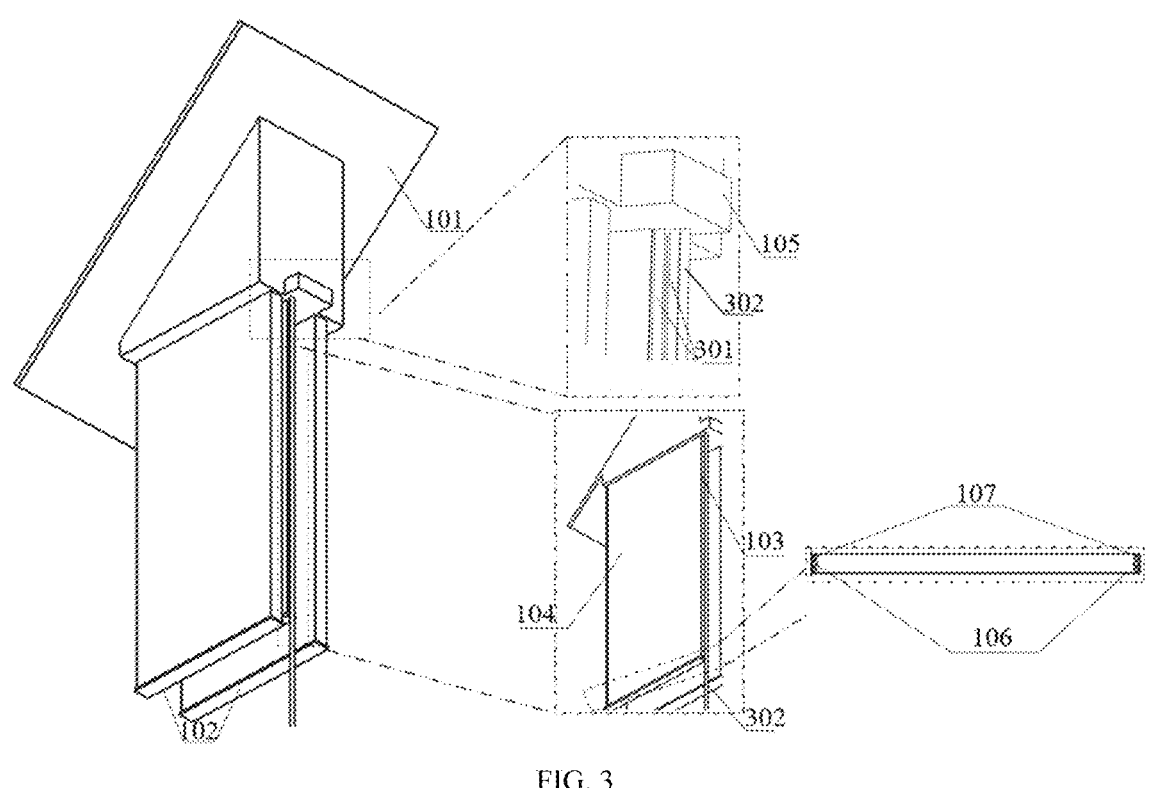
Figures 4, 5:
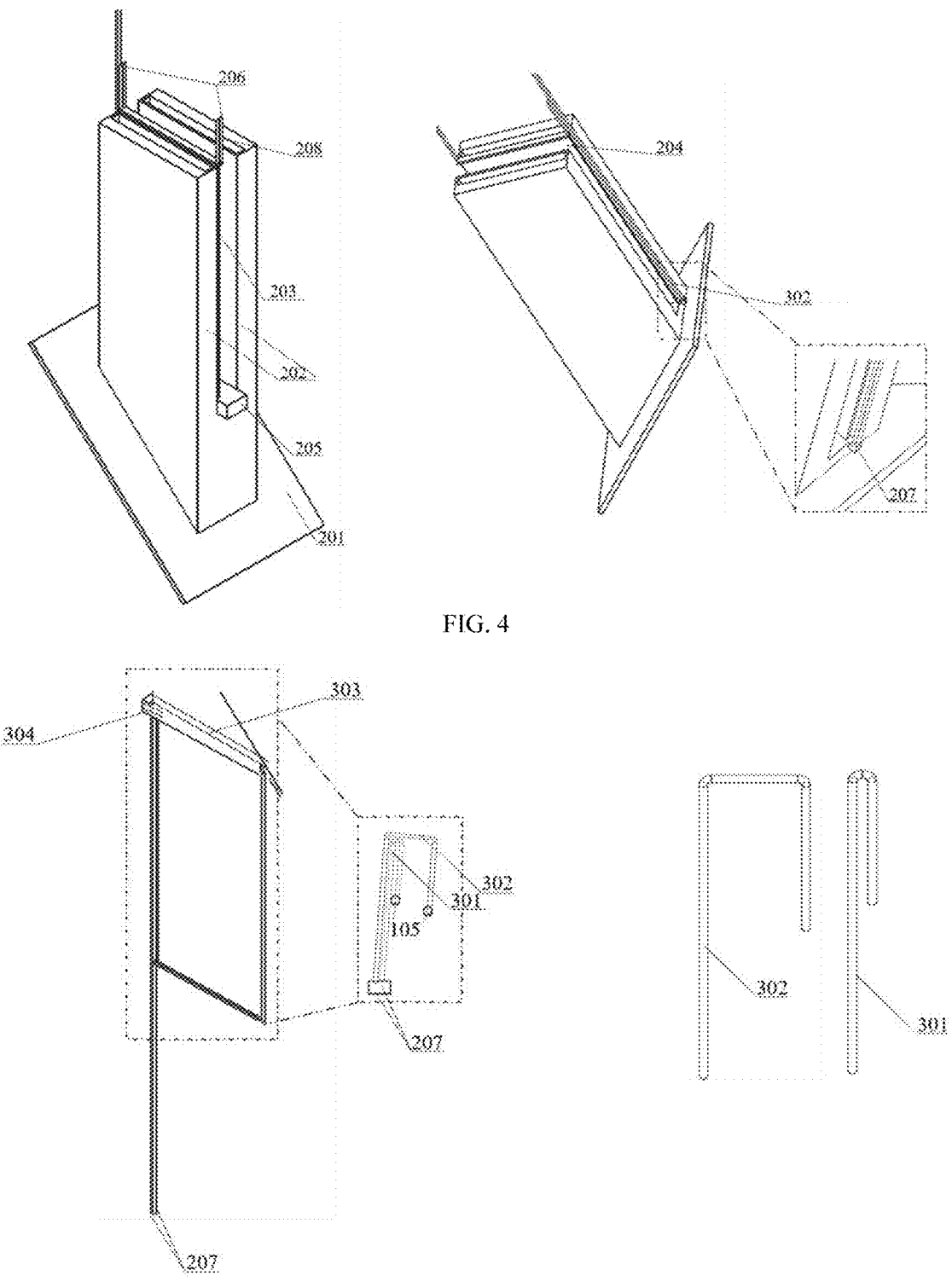
Figure 6:
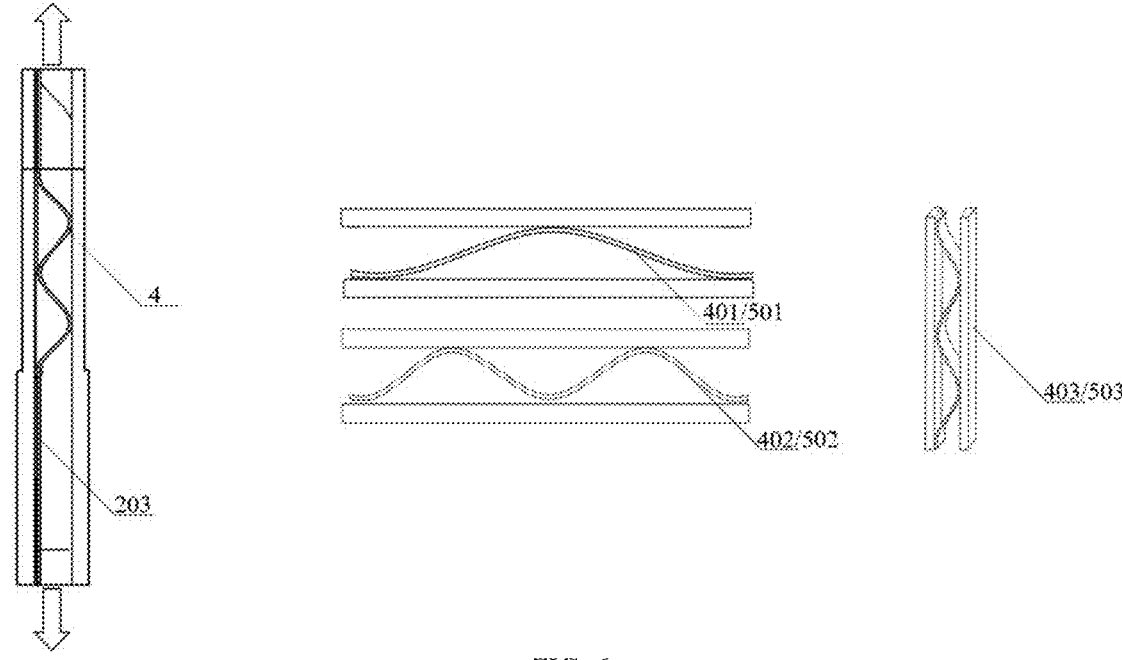
Figure 7:
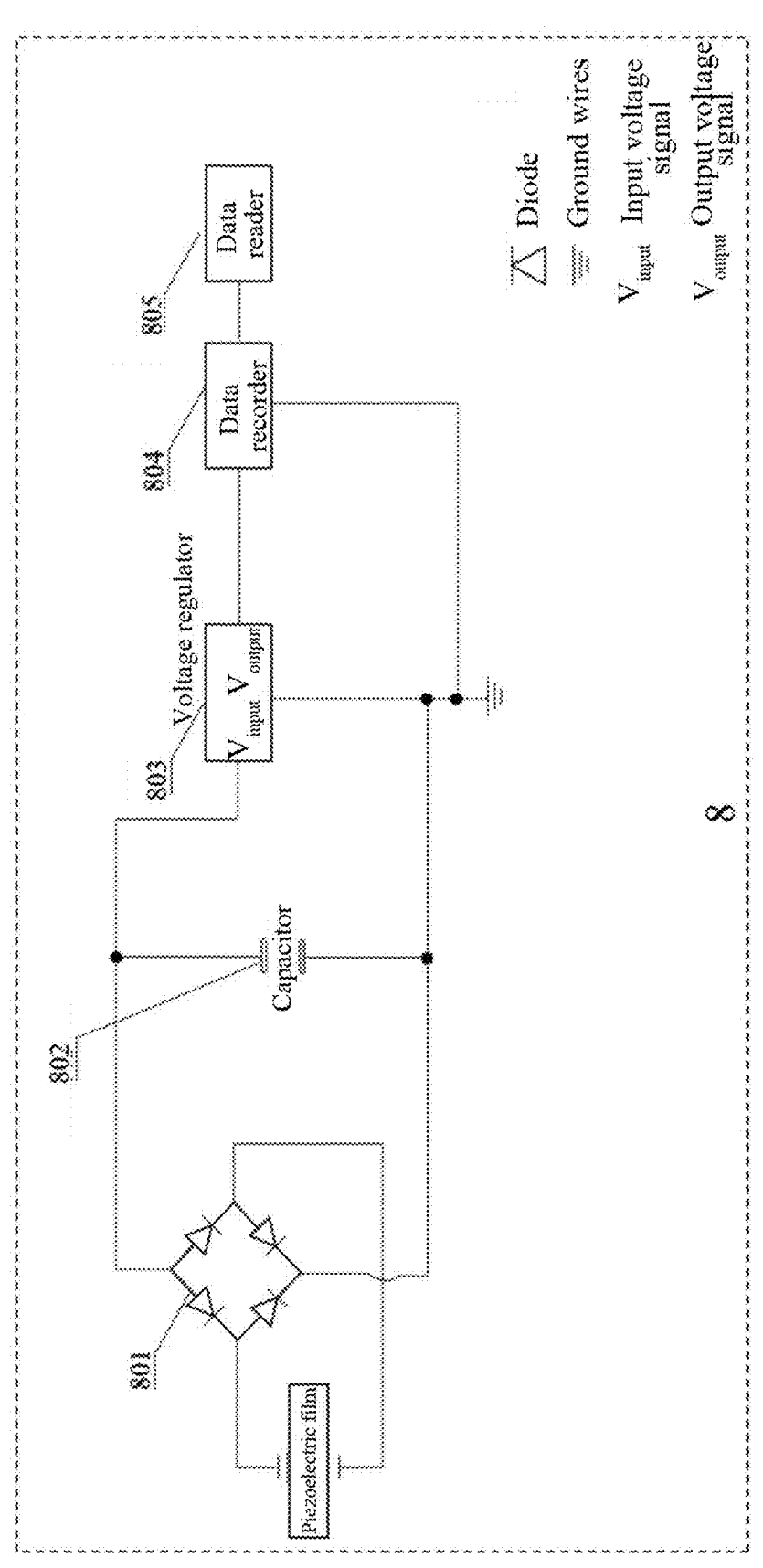

FIG. 2 is a structure schematic diagram of the working principle of the present disclosure;

FIG. 3 is a schematic diagram of the upper unit;

FIG. 4 is a schematic diagram of the lower unit;

FIG. 5 is a schematic diagram of the structure of the traction system;

FIG. 6 is a schematic diagram of the deformation mode of the deformable plate; and FIG. 7 is a schematic diagram of the structure of the information transmission system.

Reference signs: upper unit 1; upper end connector 101; upper rigid constraint 102; upper deformable plate 103; upper piezoelectric film 104; upper data acquisition unit 105; traction rope connection point 106; guide hole 107; lower unit 2; lower end connector 201; lower rigid constraint 202; lower deformable plate 203; lower piezoelectric film 204; lower data acquisition unit 205; guide rod 206; traction system anchor point 207; sliding groove 208; traction system 3; A-type traction rope 301; B-type traction rope 302; B-type traction rope hole 303; A-type traction rope hole 304; deformed upper deformable plate 4; first upper plate deformation mode 401; second upper plate deformation mode 402; deformed lower deformable plate 5; first lower plate deformation mode 501; second lower plate deformation mode 502; information transmission system 8; diode bridge 801; capacitor 802; voltage stabilizer 803; data recorder 804; data reader 805.

DESCRIPTION OF EMBODIMENTS

The specific embodiments of the present disclosure will be further described in detail below with reference to the accompanying drawings.

As shown in FIG. 2-7, a structure displacement self-powered sensor based on post-buckling piezoelectric effect includes an upper unit 1, a lower unit 2, a traction system 3 and information transmission system 8. The upper unit 1 is slidably connected with the lower unit 2.

As shown in FIG. 3, the upper unit 1 includes an upper deformable plate 103, an upper piezoelectric film 104, an upper data acquisition unit 105, and an upper rigid constraint 102. The upper piezoelectric film 104 is bonded to the upper deformable plate 103.

The upper rigid constraint 102 includes two parallel rectangular plates, and the upper deformable plate 103 is installed between the two upper rigid constraints 102. The lower unit includes a lower rigid constraint 202. The lower rigid constraint 202 includes two parallel rectangular plates each of which is provided with sliding grooves 208, and the size of the sliding grooves 208 matches the upper rigid constraint 102. The upper rigid constraint 102 is inserted into the sliding groove 208 of the lower rigid constraint 202 for sliding connection. The lower deformable plate 203 is installed between two lower rigid constraints 202.

As shown in FIG. 4, the lower unit 2 includes a lower deformable plate 203 and a lower piezoelectric film 204, and the lower piezoelectric film 204 is bonded to the lower deformable plate 203. The lower deformable plate 203 includes four guide rods 206, and the guide rods 206 are inserted into the four guide holes 107 of the upper deformable plate 103, so that the two deformable plates are kept aligned under loading conditions. The upper rigid constraint 102 has outward protrusions to limit the displacement range.

As shown in FIG. 6, the upper data acquisition unit 105 collects and stores voltage data from the upper unit 1 when the upper deformable plate 103 and the upper piezoelectric film 104 are deformed. When in a compressed state, the upper rigid constraint 102 slides through the lower rigid constraint 2 by the sliding groove 208, so that the upper deformable plate 103 compresses the lower deformable plate 203. When the upper deformable plate 103 is deformed, the deformed upper deformable plate 4 is obtained. In an embodiment, when the upper deformable plate 103 is subjected to a small compression deformation, the deformation state of the deformable plate is the first upper plate deformation mode 401, and when the upper deformable plate 103 is subjected to large compression deformation, the deformation state of the upper deformable plate is the second upper plate deformation mode 402. When being pulled, the lower unit 2 moves away from the upper unit 1, so the upper deformable plate 103 is pulled up by the traction system 3, which results in a deformed configuration as shown in FIG. 5. At this time, the lower deformable plate 203 is not deformed.

The lower data acquisition unit 205 stores voltage data from the lower unit 2 when the lower deformable plate 203 and the lower piezoelectric film 204 are deformed. When the lower deformable plate 203 is deformed, the deformed lower deformable plate 5 is obtained. In an embodiment, when the lower deformable plate 203 is subjected to small compression deformation, the deformation state of the deformable plate is the first lower plate deformation mode 501, and when the lower deformable plate 203 is subjected to large compression deformation, the deformation state of the deformable plate is the second lower plate deformation mode 502. As shown in FIG. 6, a deformed three-dimensional view is shown.

The piezoelectric film is firmly bonded to the deformable plate so that deformation from the deformable plate is coupled into the piezoelectric film. The coupled deformation of the piezoelectric film causes the upper deformable plate 103 and the lower deformable plate 203 to generate a voltage signal when deformed and transmit the voltage signal to the information transmission system 8 for data reading and recording.

The upper end surface of the upper unit 1 is provided with an upper end connector 101, and the lower end surface of the lower unit 2 is provided with a lower end connector 201. The units are installed between two parallel surfaces by the upper end connector 101 and the lower end connector 201.

As shown in FIG. 2, when the upper end connector 101 and the lower end connector 201 are perpendicular to two parallel surfaces, the direct displacement can be monitored, and when the upper end connector 101 and the lower end connector 201 are inclined to two parallel surfaces, the shear displacement can be monitored.

As shown in FIG. 5, the traction system 3 includes a traction system anchor point 207, a B-type traction rope 302, an A-type traction rope 301, and a traction rope connection point 106. In addition to the traction rope and the deformable plate, the upper unit comprises an upper rigid unit, which includes B-type traction rope holes 303 and A-type traction rope holes 304 to allow the traction rope to pass through. The traction rope is connected to the upper deformable plate 103 at two points of the traction rope connection point 106. The A-type traction rope 301 passes through the A-type traction rope hole 304 at the bottom of the upper unit, and the B-type traction rope 302 passes through the B-type traction rope hole 303 at the bottom of the upper unit, anchored at the traction system anchor point 207 to form a traction system. The traction system anchor point 207 is connected to the upper deformable plate 103 through the traction rope connection point 106. One end of the A-type traction rope 301 is fixed to the traction system anchor point

207, and the other end passes through the traction rope connection point 106, enters from the side of the upper data acquisition unit 105, leads out of the same side, and is fixed to the upper data acquisition unit 105 to stabilize the upper structure in the vertical direction. One end of the B-type traction rope 302 is fixed to the traction system anchor point 207, and the other end passes through the traction rope connection point 106, winds from the side of the vertical direction of the upper deformable plate 103 into the other side of the vertical direction of the upper deformable plate 103, and is connected to the tow rope connection point 106 and fixed to the upper deformable plate 103, which stabilizes the structure in the horizontal direction.

As shown in FIG. 7, the information transmission system 8 includes a diode bridge 801, a capacitor 802, a voltage stabilizer 803, a data recorder 804, and a data reader 805. An electronic signal generated by the upper deformable plate 103 and the lower deformable plate 203 under the piezoelectric effect is rectified by the diode bridge 801 and has charges stored by the capacitor 802, and then forms a stable voltage through the voltage stabilizer 803, so as to be supplies to the data recorder 804 and the data reader 805 to record and read monitoring data. The information transmission system 8 is powered by electrical energy generated under the piezoelectric effect, and the device can work without an external power supply during its service life.

Figure 1:
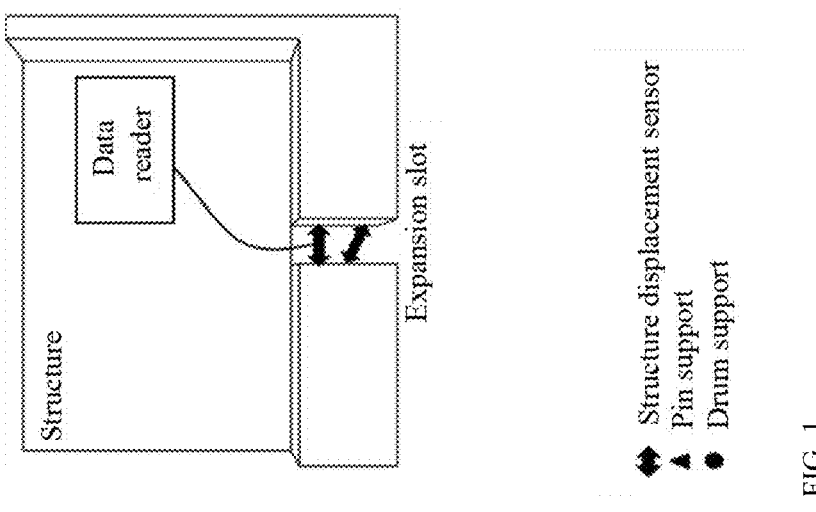
FIG. 1 is a schematic diagram of an application scenario of the present disclosure.
Figure 1:
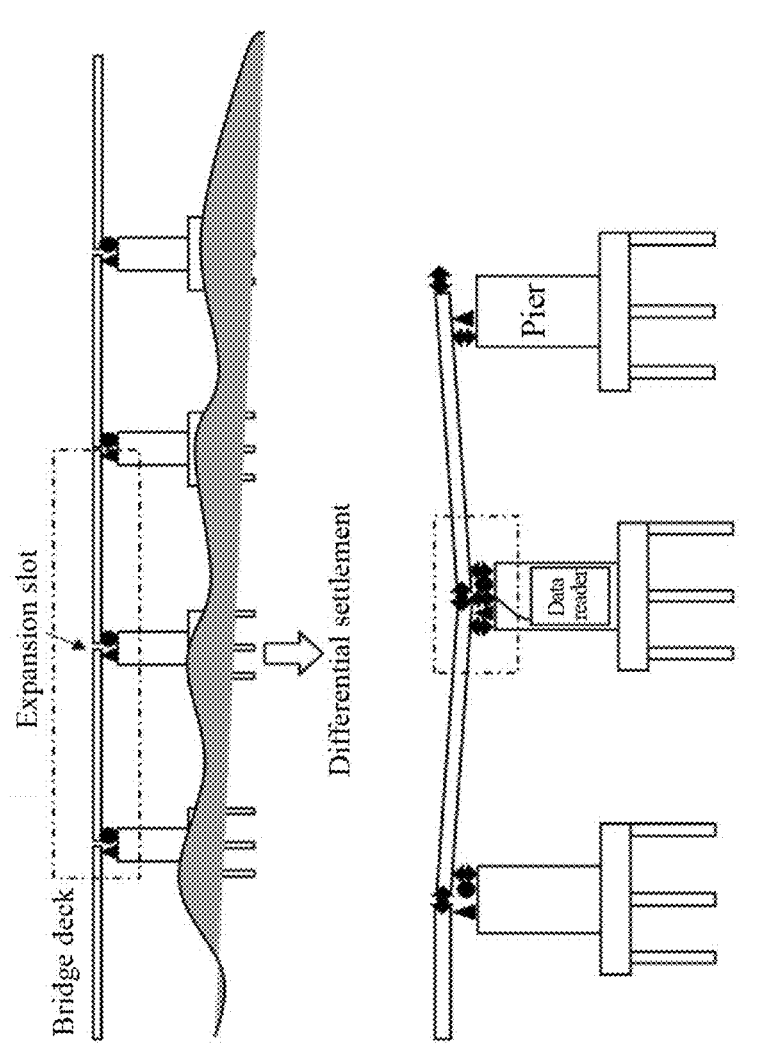

FIG. 1 shows the application field of the device. When the pier sinks due to poor foundation, the upper plate will change direction. In general, these changes in direction cannot attract people's attention in a short period, but can become very obvious in severe situations. The present disclosure can be customized to match the sensitivity of the structure under consideration, so that smaller decreasing settlements can be sensed, which would otherwise not be noticed. Another application is at the expansion slots of bridges and large structures. The bridge is always subject to translational load, and expands and contracts every day due to the characteristic thereof. These expansions and contractions can be studied by monitoring the expansion gap daily or weekly. The extent of local damage can be reflected through the variation of the measurement values, and rapid verification and maintenance can be performed. Large buildings are also moving and subsiding. As shown in FIG. 1, the device can be located between the expansion gaps to monitor the relative movement between the joints.

Finally, it should be noted that the above embodiments are only used to illustrate the technical solutions of the present disclosure, but not to be limitation thereto. Although the present disclosure has been described in detail with reference to the foregoing embodiments, those of ordinary skill in the art should understand that the technical solutions described in the foregoing embodiments can still be modified, or some or all of the technical features can be equivalently replaced. These modifications or substitutions do not make the essence of the corresponding technical solutions depart from the scope of the technical solutions of the embodiments of the present disclosure.

What is claimed is:

1. A structure displacement self-powered sensor based on post-buckling piezoelectric effect, comprising an upper unit, a lower unit and an information transmission system, wherein the upper unit is slidably connected with the lower unit, the upper unit comprises an upper deformable plate and an upper piezoelectric film, and the upper piezoelectric film is bonded to the upper deformable plate; the lower unit comprises a lower deformable plate and a lower piezoelectric film, and the lower piezoelectric film is bonded to the lower deformable plate; and when the upper deformable plate and the lower deformable plate are deformed, a voltage signal is generated and transmitted to the information transmission system for data reading and recording.

2. The structure displacement self-powered sensor based on post-buckling piezoelectric effect according to claim 1, wherein an upper end surface of the upper unit is provided with an upper end connector, and the lower end surface of the lower unit is provided with a lower end connector; and the upper unit and the lower unit are installed between two parallel surfaces by the upper end connector and the lower end connector.

3. The structure displacement self-powered sensor based on post-buckling piezoelectric effect according to claim 2, wherein when the upper end connector and the lower end connector are perpendicular to the two parallel surfaces, a direct displacement is capable of being monitored, and when the upper end connector and the lower end connector are inclined to the two parallel surfaces, a shear displacement is capable being monitored.

4. The structure displacement self-powered sensor based on post-buckling piezoelectric effect according to claim 1, wherein the upper unit comprises an upper rigid constraint; the upper rigid constraint comprises two parallel rectangular plates, and the upper deformable plate is installed between the two parallel rectangular plates of the upper rigid constraint for fixing; the lower unit comprises a lower rigid constraint; the lower rigid constraint comprises two parallel rectangular plates each of which is provided with a sliding groove, and a size of the sliding groove matches the upper rigid constraint; the upper rigid constraint is inserted into the sliding groove of the lower rigid constraint for sliding connection; and the lower deformable plate is installed between the two parallel rectangular plates of the lower rigid constraint for fixing.

5. The structure displacement self-powered sensor based on post-buckling piezoelectric effect according to claim 4, further comprising:

an upper data acquisition unit configured to collect and store voltage data from the upper unit when the upper deformable plate and the upper piezoelectric film are deformed; and a lower data acquisition unit configured to store voltage data from the lower unit when the lower deformable plate and the lower piezoelectric film are deformed.

6. The structure displacement self-powered sensor based on post-buckling piezoelectric effect according to claim 4, wherein in addition to the traction rope and the deformable plate, the upper unit comprises an upper rigid unit, and wherein the upper rigid unit includes B-type traction rope holes and A-type traction rope holes that are configured for the traction rope to pass through.

7. The structure displacement self-powered sensor based on post-buckling piezoelectric effect according to claim 6, further comprising:

a traction system comprising a traction system anchor point, a B-type traction rope, an A-type traction rope and a traction rope connection point, wherein the traction system anchor point is connected to the upper deformable plate through the traction rope connection point; one end of the A-type traction rope is fixed to the traction system anchor point, and another end of the A-type traction rope passes through the traction rope connection point, enters from and leads out of a side of an upper data acquisition unit, and then is fixed to the upper data acquisition unit to stabilize upper structure of the structure displacement self-powered sensor in a vertical direction; one end of the B-type traction rope is fixed to the traction system anchor point, and another end of the B-type traction rope passes through the traction rope connection point, wind from a side of a vertical direction of the upper deformable plate to an opposite side of the vertical direction of the upper deformable plate, and then is connected to the traction rope connection point to stabilize the structure displacement self-powered sensor in a horizontal direction.

8. The structure displacement self-powered sensor based on post-buckling piezoelectric effect according to claim 4, wherein the lower deformable plate comprises four guide rods, and wherein the guide rods are inserted into four guide holes of the upper deformable plate, respectively, so that the upper deformable plate and the lower deformable plate are kept aligned with each other.

9. The structure displacement self-powered sensor based on post-buckling piezoelectric effect according to claim 4, wherein the upper rigid constraint comprises an outward protrusion configured to limit a displacement range.

10. The structure displacement self-powered sensor based on post-buckling piezoelectric effect according to claim 1, wherein the information transmission system comprises a diode bridge, a capacitor, a voltage stabilizer, a data recorder and a data reader, an electric signal generated by the upper deformable plate and the lower deformable plate under piezoelectric effect is rectified by the diode bridge and has charges stored by the capacitor, and then forms a stable voltage by the voltage stabilizer, so as to be supplies to the data recorder and the data reader to record and read monitoring data; and the information transmission system is powered by electrical energy generated under piezoelectric effect, so as to work without external power supply during a service life of the information transmission system.

* * * * *